US008526185B2

(12) United States Patent
Heidepriem et al.

(10) Patent No.: US 8,526,185 B2
(45) Date of Patent: Sep. 3, 2013

(54) COLLAR FOR ELECTRICALLY GROUNDING A HEAT SINK FOR A COMPUTER COMPONENT

(75) Inventors: Eric Heidepriem, Fuquay Varina, NC (US); Robert Grimes, Apex, NC (US)

(73) Assignee: Cisco Technology, Inc., San Jose, CA (US)

( * ) Notice: Subject to any disclaimer, the term of this patent is extended or adjusted under 35 U.S.C. 154(b) by 327 days.

(21) Appl. No.: 12/906,783

(22) Filed: Oct. 18, 2010

(65) Prior Publication Data

US 2012/0092826 A1    Apr. 19, 2012

(51) Int. Cl.
*H05K 7/20* (2006.01)
(52) U.S. Cl.
USPC ............................. 361/712; 361/709; 174/548
(58) Field of Classification Search
USPC .......... 361/679.46–679.48, 679.54, 688–690, 361/361/694–697, 701–704, 707, 709, 712–713, 361/753, 818
See application file for complete search history.

(56) References Cited

U.S. PATENT DOCUMENTS 6,512,675 B1    1/2003    Tarter et al.
7,327,577 B2    2/2008    Gilliland et al.

*Primary Examiner* — Courtney Smith
(74) *Attorney, Agent, or Firm* — Brinks Hofer Gilson & Lione

(57) ABSTRACT

To reduce the impedance of the ground path from a heat sink to a ground pad on a printed circuit board, and thus reduce electromagnetic interference, an electrically conductive collar is arranged around an opening in the heat sink. The electrically conductive collar may include an internal extension, such that the internal extension abuts the conducting member passed through the electrically conductive collar and the opening in the heat sink to electrically ground the heat sink to the ground pad on the printed circuit board.

21 Claims, 3 Drawing Sheets

COLLAR FOR ELECTRICALLY GROUNDING A HEAT SINK FOR A COMPUTER COMPONENT

FIELD

The present embodiments relate to a collar for electrically grounding a heat sink for a computer component.

BACKGROUND

A heat sink may be used in electronic systems (e.g., a computer, a router or a switch) to transfer heat generated in electronic components such as, for example, a computer processor to the surrounding air. The heat sink may be electrically grounded to reduce the transmission of electromagnetic energy.

The heat generated in the computer processor increases as computer processor speeds increase. To aid in the dissipation of heat generated in the computer processor, the size of the heat sink and the number of fins may be increased to provide a greater surface area for convection cooling between the heat sink and the surrounding air. The larger heat sink may use a more robust attachment assembly such as, for example, a shoulder screw and spring combination to attach the heat sink to a ground pad of a printed circuit board, grounding the heat sink and supplying the appropriate pressure to the computer processor located between the heat sink and the printed circuit board. The incidental ground path for such an attachment assembly is from the heat sink, through the spring to the screw head, through the shaft of the screw, and to the ground pad on the PCB.

DETAILED DESCRIPTION OF THE DRAWINGS

Overview

Figure 2:
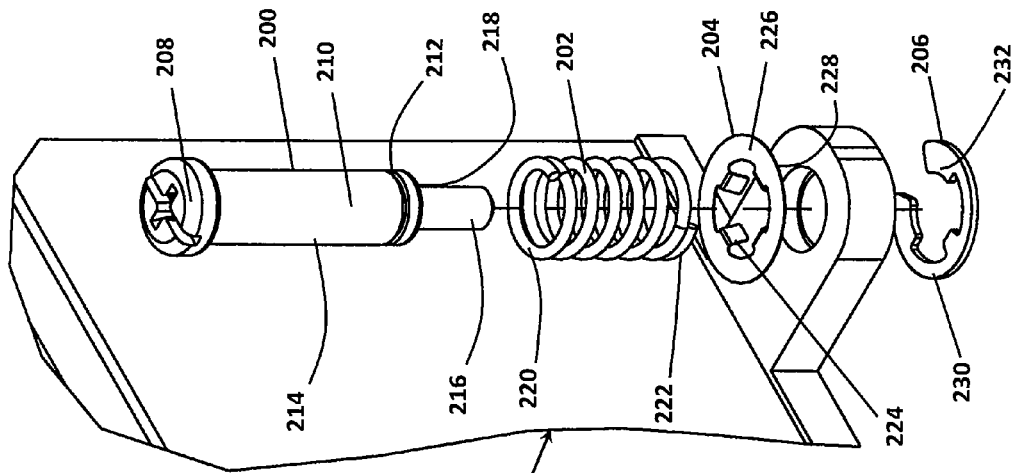
FIG. 2 illustrates an exploded view of one embodiment of an assembly for attaching and electrically grounding a heat sink.

To reduce the impedance of the ground path from a heat sink to a ground pad on a printed circuit board, and thus reduce electromagnetic interference (EMI), an electrically conductive collar is arranged around an opening in the heat sink. The electrically conductive collar may include an internal extension, such that the internal extension abuts the conducting member passed through the electrically conductive collar and the opening in the heat sink to electrically ground the heat sink to the ground pad on the printed circuit board.

In one embodiment, an apparatus includes a heat dissipating computer component including a base and an opening, the opening extending through the base of the heat dissipating computer component. The apparatus also includes a conducting member extending through the opening of the heat dissipating computer component and being electrically grounded. The apparatus includes an electrically conductive collar including an extension, the conducting member extending through the electrically conductive collar. The electrically conductive collar abuts one of a first surface of the base of the heat dissipating computer component and the conducting member, and the extension of the electrically conductive collar abuts the other of the first surface of the base of the heat dissipating computer component and the conducting member.

In another embodiment, an apparatus includes a printed circuit board including a ground pad, and an electrical component that generates heat when operating, the electrical component including a first surface and being electrically connected to the printed circuit board. The apparatus also includes a heat sink including a base, the base including a first surface, a second surface and an opening. The second surface of the base is operable to contact the first surface of the electrical component for dissipating the heat generated by the electrical component. The apparatus also includes an assembly for electrically grounding the heat sink. The assembly includes a conducting member extending through the opening of the heat sink and abutting the ground pad on the printed circuit board, and an electrically conductive collar including an internal finger extending away from the electrically conductive collar. The conducting member also extends through the electrically conductive collar. The electrically conductive collar abuts the first surface of the base of the heat sink, and the internal finger of the electrically conductive collar abuts the conducting member.

In yet another embodiment, a method includes positioning a conducting member in an electrically conductive collar and an opening in a heat dissipating computer component attachable to an electrical component operable to generate heat, such that an internal extension of the electrically conductive collar is in contact with the conducting member. The method also includes electrically grounding the conducting member and applying a force to a first surface of the electrically conductive collar, such that a second surface of the electrically conductive collar is in contact with a first surface of the heat dissipating computer component.

Example Embodiments

Figure 1:
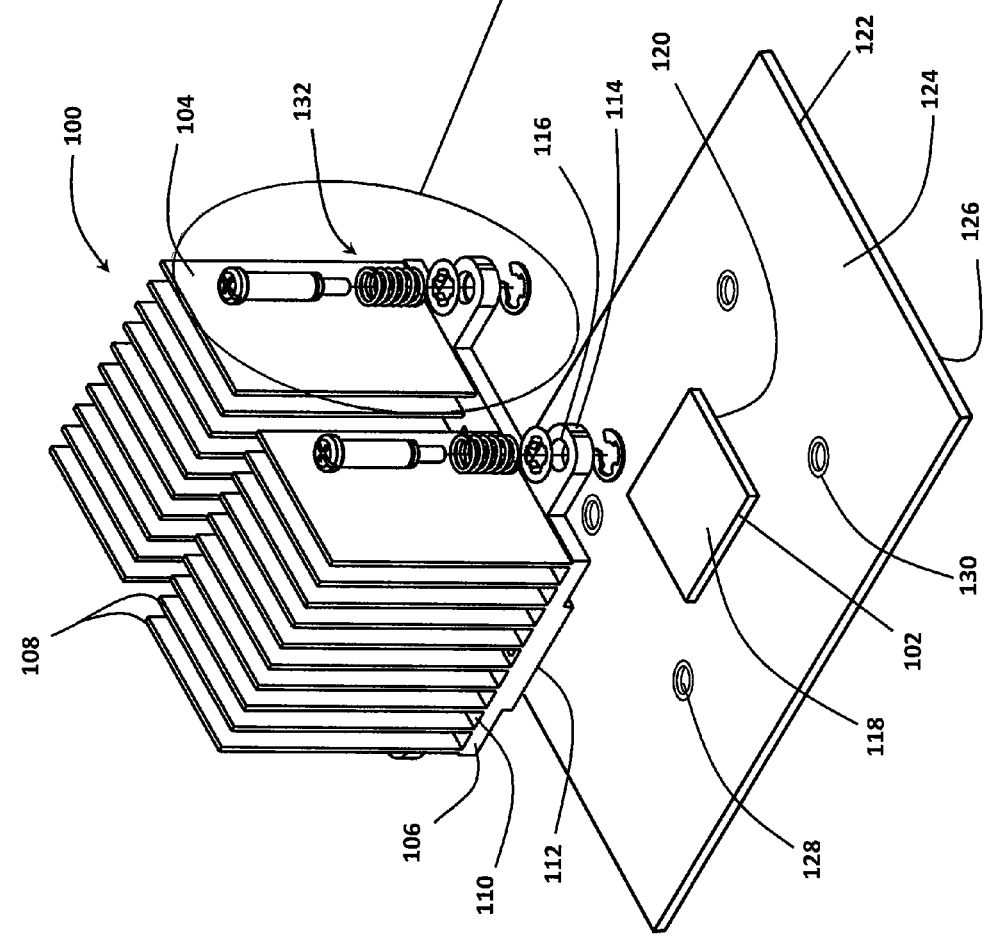
FIG. 1 illustrates an exploded view of one embodiment of a heat sink assembly for an electrical hardware component.

FIG. 1 illustrates an exploded view of one embodiment of a heat sink assembly 100 for an electrical hardware component 102. The heat sink assembly 100 includes a heat sink 104 (e.g., a heat dissipating computer component 104) including a base 106 and a plurality of fins 108 (e.g., twenty vertically-extending fins 108) extending away from the base 106 in a direction generally perpendicular to a top surface 110 and/or a bottom surface 112 of the base 106. "Generally" allows for other angles while still extending in a direction away from the top surface 110 and/or the bottom surface 112 of the base 106. The base 106 includes one or more clear areas or one or more flanges 114 (e.g., four flanges 114). The flanges 114 extend at any angle to allow connection, such as extending away from the plurality of fins 108 in a direction generally perpendicular to the plurality of fins 108. "Generally" allows for other angles while still extending in a direction away from the plurality of fins 108. Each clear area of the base or flange 114 of the plurality includes a hole 116 extending from the top surface 110 of the base 106 to the bottom surface 112 of the base 106 or through the flange 114. The heat sink 104 may include more or fewer fins 108 and/or flanges 114. In one embodiment, the assembly 100 includes a heat pipe (not shown) instead of or in addition to the heat sink 104.

The heat sink 104 may be made of any number of thermally and electrically conducting materials and finishes including, for example, nickel-plated copper, alodine-treated aluminum, aluminum alloys or stainless steel. The base 106 and the plurality of fins 108 may be formed as one piece or may be a combination of contacting pieces. The base 106 and the plurality of fins 108 may be made of the same or different materials. Each fin 108 of the plurality may extend away from the base 106 in the same or different directions. The plurality of fins 108 may be pin fins, straight fins, flared fins or a combination thereof.

The electrical hardware component 102 includes a top surface 118 and a bottom surface 120. The electrical hardware component 102 may be, for example, a specialized processor (e.g., an application specific integrated circuit (ASIC)), a generalized processor, dynamic random access memory (DRAM), flash memory, or other heat generating electrical device.

The bottom surface 112 of the base 106 of the heat sink 104 may be thermally attached to the top surface 118 of the electrical hardware component 102 with a layer of thermal interface material (not shown) disposed on the top surface 118 of the electrical hardware component 102 and/or the bottom surface 112 of the base 106. The layer of thermal interface material may be any number of thermal interface materials including, for example, a silicone thermal compound or a metal thermal compound. Other intervening layers may be provided, such as associated with a stack of electrical components, for example. The bottom surface 112 of the base 106 of the heat sink 104 may be adjacent to, in thermal contact with, in physical contact with and/or abut the entire top surface 118 of the electrical hardware component 102. In a pre-assembled state, the bottom surface 112 of the base 106 is not in contact or even adjacent, but may be shaped (e.g., flat or with an indentation sized for the component 102) for dissipating heat when assembled. In one embodiment, a cold plate of a heat pipe (not shown) is adjacent to, in thermal contact with, in physical contact with and/or abuts the entire top surface 118 of the electrical hardware component 102.

The electrical hardware component 102 is supported by a printed circuit board (PCB) or substrate 122 (e.g., the PCB 122). The PCB 122 includes a top surface 124 and a bottom surface 126. The bottom surface 120 of the electrical hardware component 102 may be attached or placed adjacent to the top surface 124 of the PCB 122. The bottom surface 120 of the electrical hardware component 102 may include an array of solder balls (e.g., a ball grid array (BGA)) used to conduct electrical signals from the electrical hardware component 102 to the PCB 122. The BGA of the bottom surface 120 of the electrical hardware component 102 may be attached to corresponding contact pads on the PCB 122 using, for example, reflow soldering. Other arrangements of conductive materials such as, for example, an array of conductive pins may be provided on the electrical hardware component 102 to conduct electrical signals from the electrical hardware component 102 to the PCB 122.

The PCB 122 also includes a plurality of holes 128 that extend through the PCB 122, from the top surface 124 to the bottom surface 126 of the PCB 122. The plurality of holes 128 may be non-plated or plated through holes with a top ground pad 130 and a bottom ground pad (not shown). The top ground pad 130 and the bottom ground pad may be made from any number of electrically conductive materials including, for example, copper.

The heat sink assembly 100 also includes a plurality of assemblies 132 (e.g., four assemblies 132; described in more detail below) for attaching and electrically grounding the heat sink 104 to the PCB 122. The plurality of assemblies 132 may be located at the holes 116 of the plurality of flanges 114 and may attach the heat sink 104 to the PCB 122 at the plurality of holes 128 in the PCB 122. The plurality of assemblies 132 provide mechanical support for the heat sink 104 and provide loading to maintain contact between the bottom surface 112 of the base 106 of the heat sink 104 and the top surface 118 of the electrical hardware component 102 (and the layer of thermal interface material).

The heat sink 104 aids in the removal of waste heat generated in the electrical hardware component 102, thus keeping the electrical hardware component 102 within a safe operating temperature limit and improving performance of the electrical hardware component 102. Waste heat generated in the electrical hardware component 102 is conducted through the layer of thermal interface material and the heat sink 104, and convected to the surrounding fluid (e.g., the surrounding air). The heat sink 104 may be air-cooled by one or more fans (not shown) or by natural convection. As the number of fins 108 and the surface area of each fin 108 increases, the heat transfer from the heat sink 104 to the surrounding air may also increase. As the size of the heat sink 104 increases, a more robust assembly 132 may be used to provide a strong mechanical attachment and a high preload on the layer of thermal interface material between the base 106 of the heat sink 104 and the electrical hardware component 102.

FIG. 2 illustrates an exploded view of one embodiment of an assembly 132 for attaching and electrically grounding a heat sink 104. The assembly 132 includes a conducting member 200 (e.g., a shoulder screw 200), a spring 202 (e.g., a compression coil or helical spring 202), an electrically conductive collar 204 (e.g., a ground collar 204) and a retaining ring 206 (e.g., an external retaining ring 206). The shoulder screw 200 includes a screw head 208, a shaft 210 and a groove 212 that extends at least partly around the circumference of the shoulder screw 200. A first part 214 of the shaft 210 has a greater diameter than a second part 216 of the shaft 210, such that a screw shoulder 218 is formed. The second part 216 of the shaft 210 may include threads for attaching the assembly 132, and thus the heat sink 104, to a grounded feature such as a tapped chassis toadstool (not shown) or a standoff of an electronic system, in which the PCB 122 and the electrical hardware component 102 are installed. The electronic system may be a computer, a router or a switch, for example. The conducting member 200 may be made of any number of electrically conducting materials including, for example, steel with a plated finish. Other conducting members 200 such as, for example, push pins having a shaft with a constant diameter may be used.

The coil spring 202 includes a plurality of coils (e.g., seven coils) including a first coil 220 and a last coil 222. At least part of the shaft 210 of the shoulder screw 200 is disposed through the coil spring 202 (e.g., the coil spring 202 encircles at least part of the shaft 210 of the shoulder screw 200). The coil spring 202 may be made of any number of materials including, for example, steel or beryllium copper. The coil spring 202 may include more or fewer coils. Other springs including, for example, a cantilever spring may be used. In one embodiment, the assembly 132 does not include the spring 202.

The ground collar 204 includes a top surface 226, a bottom surface 228 and a plurality of internal fingers 224 (e.g., four internal fingers or extension 204) that extend in a direction away from the ground collar 204. The ground collar 204 is disposed around the hole 116 of one flange 114 of the heat sink 104, and at least part of the shaft 210 of the shoulder screw 200 is disposed through the ground collar 204 and the hole 116. The ground collar 204 may be made of any number of electrically conductive materials with a high elasticity such as, for example, beryllium copper with a matte tin finish (e.g., to reduce corrosion). The ground collar 204 may include more or fewer internal fingers 224. The top surface 226 and/or the bottom surface 228 of the ground collar 204 may be circular and flat. In other embodiments, the top surface 226 and/or the bottom surface 228 of the ground collar 204 may be curved, rough or have other texture or shape.

The plurality of fingers 224 are dimensioned and extend away from the ground collar 204 such that the plurality of fingers 224 are in physical contact with, are electrically connected to, or abuts the shaft 210 of the shoulder screw 200. At least part of the first coil 220 of the coil spring 202 abuts the screw head 208, and at least part of the last coil 222 of the coil spring 202 abuts the top surface 226 of the ground collar 204. The coil spring 202 is used in compression, such that the bottom surface 228 of the ground collar 204 is forced towards the top surface 110 of the base 106 of the heat sink 104, maintaining physical contact between the ground collar 204 and the heat sink 104.

The retaining ring 206 includes a top surface 230 and a plurality of internal extensions 232 (e.g., three internal extensions 232) extending away from the retaining ring 206. Part of the plurality of extensions 232 of the retaining ring 206 is disposed in the groove 212 on the shaft 210 of the shoulder screw 200, such that the top surface 230 of the retaining ring 206 may abut the bottom surface 112 of the base 106 of the heat sink 104. The retaining ring 206 may maintain the coil spring 202 in a compressed state between the screw head 208 and the top surface 226 of the ground collar 204, forcing the ground collar 204 towards the top surface 110 of the base 106 of the heat sink 104. The retaining ring 206 may include more, fewer or no internal extensions 232. In one embodiment, the assembly 132 does not include the retaining ring 206, and the top surface 124 of the PCB 122 abuts the bottom surface 112 of the base 106 of the heat sink 104.

When the heat sink assembly 100 is secured to the tapped chassis toadstools or the standoff of the electronic system with the shoulder screws 200, the screw shoulders 218 are adjacent to, in physical contact with, electrically connected to, or abut the top ground pads 130 of the PCB 122 (shown in FIG. 1). The heat sink 104 is thus grounded, as ground paths are provided from the heat sink 104, through the ground collars 204 and the plurality of internal fingers 224 in contact with the shafts 210 of the shoulder screws 200, through the shoulder screws 200 and to the top ground pads 130 of the PCB 122. Without the ground collar 204, the incidental ground paths provided are from the heat sink 104, through the coil springs 202, through the shoulder screws 200 and to the top ground pads 130 of the PCB 122; the ground path through the coil spring 202 is long and more resistive to the flow of radiofrequency (RF) energy. With the ground collar 204, the length of the ground path is reduced, and the resulting EMI is also reduced.

Figure 3:
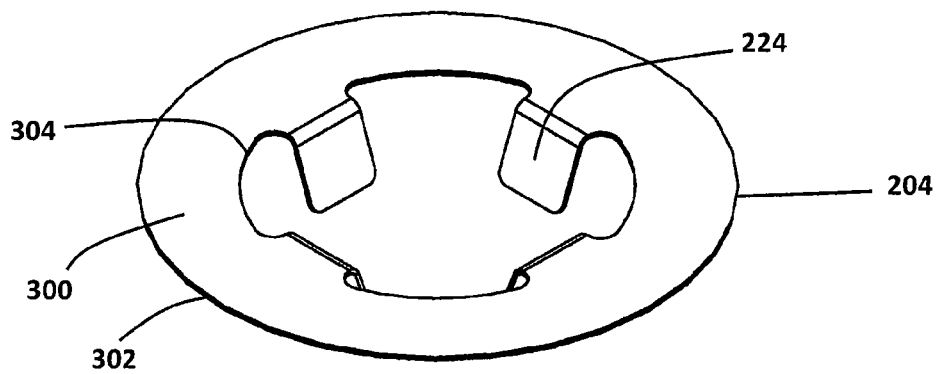
FIG. 3 illustrates an isometric view of one embodiment of a ground collar.
Figure 4:
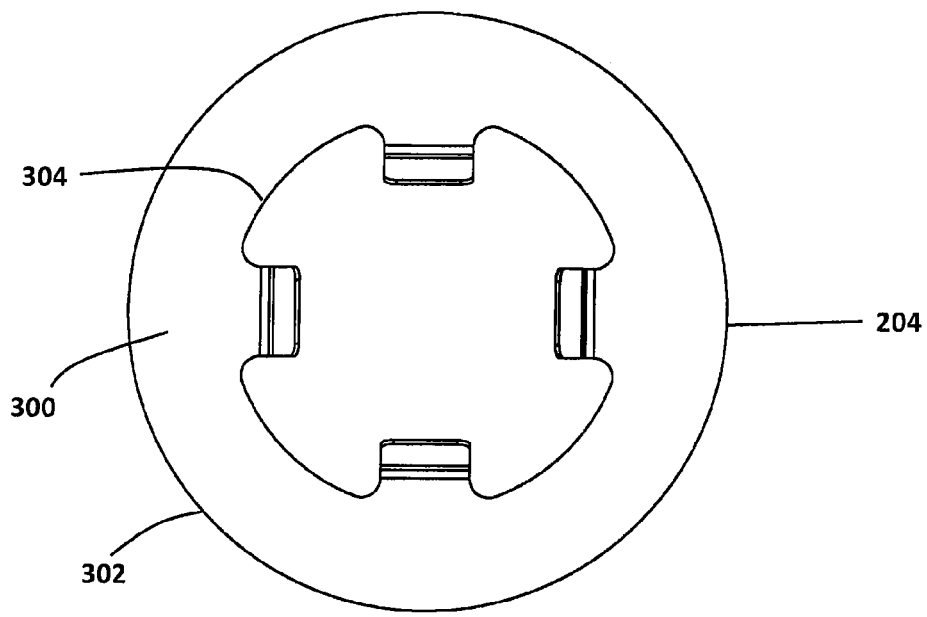
FIG. 4 illustrates a top view of one embodiment of a ground collar.
Figure 5:
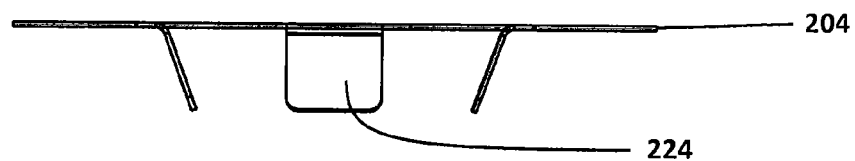
FIG. 5 illustrates a front view of one embodiment of a ground collar.

FIGS. 3-5 illustrate an isometric view, a top view and a front view of one embodiment of a ground collar 204, respectively. The ground collar 204 includes an annular body 300 having an external perimeter 302 and an internal perimeter 304. The external perimeter 302 and the internal perimeter 304 of the annular body 300 may be concentric and the same shape (e.g., circular). The plurality of internal fingers 224 may be equally-spaced around the internal perimeter 304 of the annular body 300 and may extend from the internal perimeter 304 of the annular body 300 in a direction away from the annular body 300. As the number of internal fingers 224 increases, a better contact between the ground collar 204 and the shaft 210 of the shoulder screw 200 may be provided; as the surface area of the ground collar 204 in contact with the shaft 210 of the shoulder screw 200 increases, a better ground may be provided.

The body 300 of the ground collar 204 may be other shapes such as, for example, rectangular. The external perimeter 302 and the internal perimeter 304 of the annular body 300 may be different shapes and may not be concentric. In one embodiment, the shape of the internal perimeter 304 of the body 300 of the ground collar 204 is a square, and the shape of a cross-section through the shaft 210 of the shoulder screw 200 is also a square. In one embodiment, the ground collar 204 may not include any internal fingers 224, and the diameter of the internal perimeter 304 of the annular body 300 may be the same as the outer diameter of the shaft 210 of the shoulder screw 200. In another embodiment, the ground collar 204 includes a plurality of external fingers or extensions extending from the external perimeter 302 of the annular body 300, in a direction away from the annular body 300.

The ground collar 204 is not dependent upon the height of the electrical hardware component 102 to make electrical contact with the top ground pad 130 of the PCB 122. Additionally, the ground collar 204 does not use additional PCB 122 real estate beyond what is already used by the shoulder screw 200. The ground collar 204 may be used to ground other heat dissipating computer components such as, for example, heat pipes.

Figure 6:
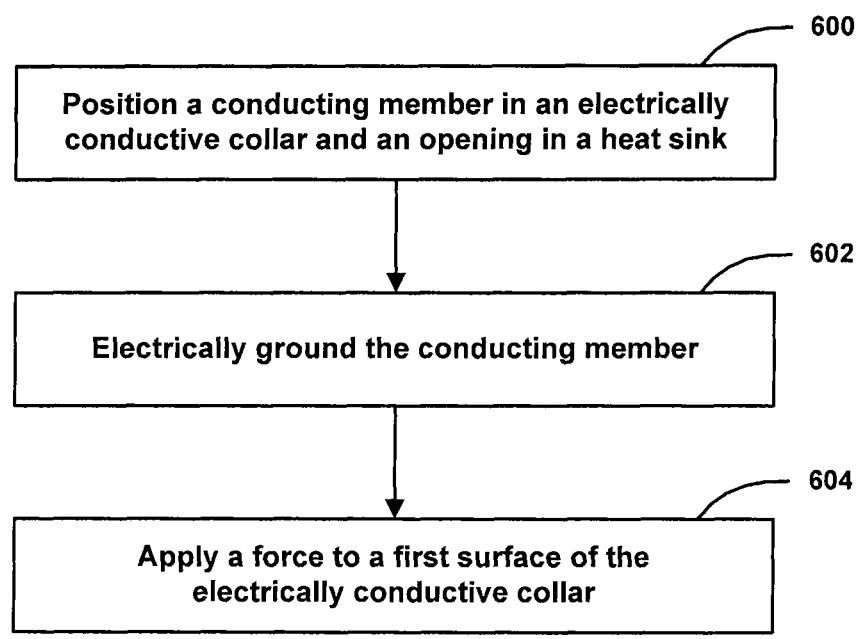
FIG. 6 illustrate a flow chart of one embodiment of grounding a heat sink using the ground collar of FIGS. 3-5.

FIG. 6 illustrates a flow chart of one embodiment of grounding a heat sink using a ground collar. The method is implemented in the order shown, but other orders may be used. Additional, different, or fewer acts may be provided.

At block 600, a conducting member is positioned in an electrically conductive collar and an opening in a heat sink attached to an electrical hardware component. The electrically conductive collar may include an extension extending from an internal perimeter of the electrically conductive collar, in a direction away from the electrically conductive collar. The conducting member is positioned in the electrically conductive collar, such that the extension is electrically connected to, adjacent to, physically connected to or abuts the conducting member.

The electrically conductive collar may include additional extensions extending from the internal perimeter of the electrically conductive collar. In one embodiment, the electrically conductive collar does not include any extensions, and the diameter of the internal perimeter of the electrically conductive collar is equal to the diameter of a shaft of the conducting member. The electrically conductive collar may be made of any number of materials including, for example, beryllium copper. The electrically conductive collar may have a top surface and a bottom surface that are flat and circular in shape.

At block 602, the conducting member is electrically grounded. The conducting member may be positionally fixed, such that part of the conducting member is in physical contact with a grounding pad of a printed circuit board (PCB). The PCB may be electrically connected to the electrical hardware component, on which the heat sink is attached. Intervening components such as, for example, a bonding braid may be provided to electrically connect the conducting member to the grounding pad of the PCB.

At block 604, a force is applied to a surface of the electrically conductive collar. A spring may be positioned around the shaft of the conducting member, such that the spring is compressed by the conducting member to force the surface of the electrically conductive collar in a direction towards the heat sink. In one embodiment, a retaining ring may be positioned in a groove on the shaft of the conducting member, such that the retaining ring may physically contact a bottom surface of the heat sink, and the spring remains in a compressed state. In another embodiment, the conducting member is positionally fixed, such that part of the conducting member applies the force to the surface of the electrically conductive collar.

The compression may cause the conductive collar to flatten, resulting in contact of part of the collar (e.g., extensions) with the conducting member. The compression acts to more reliably establish contact between the collar and the conducting member. The compression may also press the collar against the heat sink (e.g., the flange of the heat sink or other connector hole), establishing conductive contact.

Various embodiments described herein can be used alone or in combination with one another. The foregoing detailed description has described only a few of the many possible implementations of the present invention. For this reason, this detailed description is intended by way of illustration, and not by way of limitation.

The invention claimed is:

1. An apparatus comprising:
a heat dissipating computer component comprising a base and an opening, the opening extending through the base of the heat dissipating computer component;
a conducting member extending through the opening of the heat dissipating computer component and being electrically grounded; and
an electrically conductive collar comprising a body and an extension extending from the body, the conducting member extending through the electrically conductive collar,
wherein the body of the electrically conductive collar abuts one of (a) a first surface of the base of the heat dissipating computer component or (b) the conducting member, and
wherein the extension of the electrically conductive collar abuts the other of (a) the first surface of the base of the heat dissipating computer component or (b) the conducting member.

2. The apparatus of claim 1, wherein the heat dissipating computer component is a heat sink.

3. The apparatus of claim 1, wherein the electrically conductive collar is made of beryllium-copper.

4. The apparatus of claim 1, wherein the electrically conductive collar comprises four internal extensions.

5. The apparatus of claim 1, wherein an internal perimeter of the electrically conductive collar is circular.

6. The apparatus of claim 1, wherein the conducting member is a screw comprising a head and a shoulder.

7. The apparatus of claim 6, wherein the shoulder of the screw abuts a ground pad on a printed circuit board to electrically ground the screw.

8. The apparatus of claim 6, further comprising a spring that encircles the screw, the spring comprising a first coil and a last coil,
wherein the first coil of the spring abuts the head of the screw, and the last coil of the spring abuts the electrically conductive collar to maintain contact between the electrically conductive collar and the heat dissipating computer component.

9. An apparatus comprising:
a printed circuit board comprising a ground pad;
an electrical component that generates heat when operating, the electrical component comprising a first surface and being electrically connected to the printed circuit board;
a heat sink comprising a base, the base comprising a first surface, a second surface and an opening, the second surface of the base being in contact with the first surface of the electrical component for dissipating the heat generated by the electrical component; and
an assembly for electrically grounding the heat sink, the assembly comprising:
a conducting member extending through the opening of the heat sink and abutting the ground pad on the printed circuit board; and
an electrically conductive collar comprising an internal finger extending away from the electrically conductive collar, the conducting member extending through the electrically conductive collar,
wherein the electrically conductive collar abuts the first surface of the base of the heat sink, and
wherein the internal finger of the electrically conductive collar abuts the conducting member.

10. The apparatus of claim 9, wherein the electrical component is a general processor.

11. The apparatus of claim 9, further comprising a layer of thermal interface material disposed on the first surface of the electrical component.

12. The apparatus of claim 9, wherein the conducting member is a screw comprising a head and a shoulder.

13. The apparatus of claim 12, wherein the shoulder of the screw abuts the ground pad on the printed circuit board to electrically ground the screw.

14. The apparatus of claim 12, further comprising a spring that encircles the screw, the spring comprising a first coil and a last coil,
wherein the first coil of the spring abuts the head of the screw, and the last coil of the spring abuts the electrically conductive collar to maintain contact between the electrically conductive collar and the heat sink.

15. A method comprising:
positioning a conducting member in an electrically conductive collar and an opening in a heat dissipating computer component attachable to a heat generating electrical component, such that an internal extension extending inward from an inner perimeter of an annular body of the electrically conductive collar is in contact with the conducting member;
electrically grounding the conducting member; and
applying a force to a first surface of the annular body of the electrically conductive collar, such that a second surface of the annular body of the electrically conductive collar is in contact with a first surface of the heat dissipating computer component.

16. The method of claim 15, wherein the heat dissipating computer component is a heat pipe.

17. The method of claim 15, wherein the conducting member is a screw comprising a head and a shoulder.

18. The method of claim 17, wherein electrically grounding the screw comprises contacting the shoulder of the screw with a ground pad on a printed circuit board.

19. The method of claim 17, wherein applying a force to the first surface of the annular body of the electrically conductive collar comprises compressing a spring with the screw, the spring comprising a first coil and a last coil, and
wherein the head of the screw abuts the first coil of the spring, and the first surface of the annular body of the electrically conductive collar abuts the last coil of the spring.

20. The method of claim 19, further comprising positioning at least part of a retaining ring in a groove on the screw, such that the retaining ring abuts a second surface of the heat dissipating computer component to keep the spring in compression.

21. The apparatus of claim 1, wherein the body of the electrically conductive collar comprises an annular body comprising an outer perimeter and an inner perimeter and abutting (a) the first surface of the base of the heat dissipating computer component, the conducting member is disposed within the inner perimeter, and the extension of the electrically conductive collar extends inward from the inner perimeter and abuts (b) the conducting member.

\* \* \* \* \*